US012677607B2

(12) United States Patent
Barry et al.

(10) Patent No.: US 12,677,607 B2
(45) Date of Patent: Jul. 7, 2026

(54) VAPOR DEPOSITION PROCESSES, REACTANTS AND DEPOSITION ASSEMBLIES

(71) Applicant: ASM IP Holding, B.V., Almere (NL)

(72) Inventors: Sean T. Barry, Ottawa (CA); Goran Bacic, Ottawa (CA); Charles Dezelah, Helsinki (FI); Timothee Blanquart, Oud-Heverlee (BE); René Henricus Jozef Vervuurt, Leuven (BE); Peter Gordon, Ottawa (CA)

(73) Assignee: ASM IP Holding B.V., Almere (NL)

( * ) Notice: Subject to any disclaimer, the term of this patent is extended or adjusted under 35 U.S.C. 154(b) by 423 days.

(21) Appl. No.: 18/190,542

(22) Filed: Mar. 27, 2023

(65) Prior Publication Data

US 2023/0307239 A1 Sep. 28, 2023

Related U.S. Application Data

(60) Provisional application No. 63/324,261, filed on Mar. 28, 2022.

(51) Int. Cl.
*C23C 16/455* (2006.01)
*H10P 14/43* (2026.01)

(52) U.S. Cl.
CPC ........ *H10P 14/43* (2026.01); *C23C 16/45527* (2013.01); *C23C 16/45553* (2013.01)

(58) Field of Classification Search
CPC .................... C23C 16/45527; C23C 16/45553
See application file for complete search history.

(56) References Cited

U.S. PATENT DOCUMENTS

| | | | | |
|---|---|---|---|---|
| 7,910,177 B2 * | 3/2011 | Li | C23C 16/45523 | 438/758 |
| 2008/0132050 A1 * | 6/2008 | Lavoie | H01L 21/76873 | 438/584 |
| 2009/0321733 A1 * | 12/2009 | Gatineau | C01G 25/02 | 438/758 |
| 2011/0275166 A1 * | 11/2011 | Shero | H10P 14/6339 | 438/785 |
| 2016/0172192 A1 * | 6/2016 | Matero | H01L 21/0262 | 438/478 |
| 2018/0182618 A1 * | 6/2018 | Blanquart | H01L 21/02219 | |
| 2018/0350587 A1 * | 12/2018 | Jia | H01L 21/02205 | |
| 2019/0249300 A1 * | 8/2019 | Hatanpää | C23C 16/45527 | |

(Continued)

OTHER PUBLICATIONS

Lim, Booyong S, et al., "Atomic layer deposition of transition metals." Nature Materials, vol. 2, Nov. 2003, pp. 749-754.*

(Continued)

*Primary Examiner* — Bret P Chen
(74) *Attorney, Agent, or Firm* — Banner & Witcoff, Ltd.

(57) ABSTRACT

Vapor phase methods of depositing a metal or a semimetal—comprising materials on a substrate are provided. In the methods, various metal or semimetal precursors may be used together with reactants that may generate hydrogen radical or amino radical to react with the metal or semimetal precursor to deposit the metal or semimetal—comprising material on the substrate. Further provided are materials and structures deposited by the disclosed methods, as well as deposition assemblies.

24 Claims, 2 Drawing Sheets

(56) References Cited

U.S. PATENT DOCUMENTS

| | | | | |
|---|---|---|---|---|
| 2021/0002765 | A1* | 1/2021 | Sato | C23C 16/403 |
| 2021/0057223 | A1* | 2/2021 | Stevens | C23C 16/34 |

OTHER PUBLICATIONS

Singh, Joseph A., et al., "Area-Selective Atomic Layer Deposition of Metal Oxides on Noble Metals through Catalytic Oxygen Activation". Chemistry of Materials, 2018, 30, 663-670.*

Van, Trinh Tu, et al., "Radical-enhanced atomic layer deposition of Y2O3 via a β-diketonate precursor and O radicals". Surface Science, vol. 596, Issues 1-3, Dec. 10, 2005, pp. 1-11.*

Bacic et al., Designing Stability into Thermally Reactive Plumbylenes, Inorg. Chem. 2018, 57, 8218-8226.

Marika Juppo, et al., Use of 1, 1-Dimethylhydrazine in the Atomic Layer Deposition of Transition Metal Nitride Thin Films, The Laboratory of Inorganic Chemistry, University of Helsinki, 00014 Helsinki, Finland, Journal of The Electrochemical Society, 147 (9) 3377-3381 (2000).

* cited by examiner

VAPOR DEPOSITION PROCESSES, REACTANTS AND DEPOSITION ASSEMBLIES

CROSS REFERENCE TO RELATED APPLICATIONS

This application claims the benefit of U.S. Provisional Application 63/324,261 filed on Mar. 28, 2022, which is hereby incorporated by reference in its entirety.

FIELD

The present disclosure relates to vapor deposition processes, reactants useful in vapor deposition processes and deposition assemblies for vapor-phase deposition of materials. More particularly, the disclosure relates to manufacture of semiconductor devices using vapor deposition processes.

BACKGROUND

Semiconductor device manufacturing for advanced technology nodes requires high-quality materials deposited uniformly over large areas and on complex 3D structures. Cyclic vapor deposition processes may be used for the deposition of such materials. However, the development of suitable precursors and other reactants for these processes is challenging. Chemicals used in cyclic vapor deposition processes need to fulfil various, partially contradicting, requirements. The properties of the deposited materials need to be carefully controllable, thermal budget of the deposition process is typically limited, and the reactants need to be both reactive enough and stable to allow industrial-scale use.

For example, the deposition of thin films of metal elements and their alloys is of increasing importance for a number of semiconductor applications. However, significant challenges still exist for the atomic layer deposition (ALD) of high-quality films of these materials. The difficulty of metal ALD is at least in part due limited number and reactivity of chemically reductive co-reactants. As another example, deposition of binary and ternary metal nitride thin films has been a topic of high importance for a long time, and will have substantial impact on the semiconductor industry. However, thermal ALD methods are limited to mostly NH3-based processes that require high temperature, or to the few common hydrazine derivatives that are commercially available.

Within vapor deposition technologies, thermal processes are sought after, as plasma may damage the underlying substrate material or compromise the conformality of the process, especially on substrates containing high aspect ratio features. However, balancing between reactivity, thermal budget and specificity in thermal deposition hampers the development of materials and material combinations for the further advancement of semiconductor devices.

Accordingly, new cyclic vapor deposition methods, reactants suitable for use in cyclic deposition processes and related vapor deposition apparatuses are desired in the art.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods of depositing material comprising a metal on a substrate by a cyclic vapor deposition process. The method comprises providing a substrate in a reaction chamber, providing a first precursor into the reaction chamber in a vapor phase, and providing a reactant into the reaction chamber in a vapor phase. The reactant may release a reactive radical species and a long-lived radical, and the reactive radical species reacts with the first precursor to form material comprising the metal on the substrate. In a variation of the methods, a semimetal is deposited instead of a metal.

In another aspect, a method of depositing a material comprising a metal or a semimetal on a substrate is disclosed. The method comprises providing a substrate in a reaction chamber, providing a first precursor into the reaction chamber in a vapor phase, and providing a reactant into the reaction chamber in a vapor phase to deposit the material comprising the metal or the semimetal on the substrate. The reactant comprises a compound of formula (II), (II)

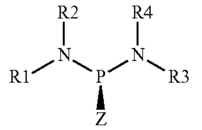

wherein each of R1, R2, R3 and R4 are independently selected from H, linear and branched C1 to C6 alkyl groups and silyl groups, and wherein Z is selected from H and $NH_2$. In a variation of the method, R2 and R4 form a ring structure comprising the two nitrogen (N) atoms and the phosphorus (P) atom.

In another aspect, a method of depositing material comprising a metal or semimetal on a substrate is disclosed. The method comprises providing a substrate in a reaction chamber, providing a first precursor into the reaction chamber in a vapor phase, and providing a reactant into the reaction chamber in a vapor phase to deposit the material comprising the metal or semimetal on the substrate, wherein the reactant comprises a compound of formula (III);

(III)

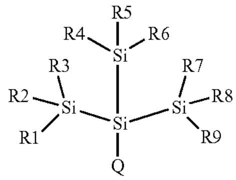

wherein each R is independently selected from H and C1 to C3 alkyl groups, and Q is selected from H, $NH_2$ and $NH—NH_2$.

In yet another aspect, a method of depositing material comprising a metal or semimetal on a substrate is disclosed. The method comprises providing a substrate in a reaction chamber, providing a first precursor into the reaction chamber in a vapor phase, and providing a reactant into the reaction chamber in a vapor phase to deposit the material comprising the metal or semimetal on the substrate, wherein the reactant comprises a compound of formula (IV). R1 and R2 are independently selected from linear and branched C2 to C6 alkyl groups, and R3 and R4 from H and linear and branched C1 to C6 alkyl groups.

(IV)

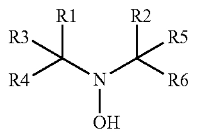

In further aspect, a method of depositing material comprising a metal or semimetal on a substrate is disclosed. The method comprises providing a substrate in a reaction chamber, providing a first precursor into the reaction chamber in a vapor phase; and providing a reactant into the reaction chamber in a vapor phase to deposit the material comprising the metal or semimetal on the substrate, wherein the reactant comprises a compound of formula (V);

(V)

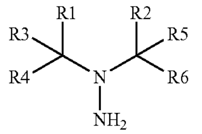

wherein R1 and R2 are independently selected from linear and branched C2 to C6 alkyl groups, and R3 and R4 from H and linear and branched C1 to C6 alkyl groups.

In a yet further aspect, a method of depositing material comprising a metal or semimetal on a substrate is disclosed. The method comprises providing a substrate in a reaction chamber, providing a first precursor into the reaction chamber in a vapor phase, and providing a reactant into the reaction chamber in a vapor phase to deposit the material comprising the metal or semimetal on the substrate, wherein the reactant comprises a compound of formula (VI);

(VI)

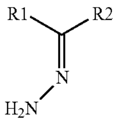

wherein R1 and R2 are independently selected from H, linear, branched and cyclic C1 to C10 alkyl groups.

The current disclosure additionally relates to a deposition assembly for depositing a material comprising a metal or a semimetal on a substrate. The deposition assembly comprises one or more reaction chambers constructed and arranged to hold the substrate, a precursor injector system constructed and arranged to provide a first precursor and a reactant into the reaction chamber in a vapor phase; wherein the first precursor comprises a metal or a semimetal compound and the deposition assembly further comprising a firsts precursor vessel constructed and arranged to contain a first precursor and a second precursor vessel constructed and arranged to contain the reactant. The assembly is constructed and arranged to provide the first precursor and the reactant via the precursor injector system to the reaction chamber to deposit metal or semimetal-containing material on the substrate.

In an aspect, a composition for depositing a metal or semimetal-comprising material on a substrate is disclosed. The composition comprises a reactant according to the current disclosure, such as a compound selected from group of compounds (I) to (VI) according to the current disclosure. The vapor pressure of the composition is ≥1 Torr at a temperature below 150° C. The decomposition temperature of the composition, or a compound contained therein is at least 30° C. higher than a vapor delivery temperature used to deposit a metal or a semimetal-comprising material. The composition is substantially stable for at least 3 months at source temperature. In some embodiments, a composition according to the current disclosure comprises a compound selected from a group consisting of compounds (I), (Ia), (Ib), (Ic), (Id), (Ie), (If), (Ig), (Ih), (Ii), (If), (Ik), (Il), (Im), (In), (Io), (Ip), (II), (IIa), (IIb), (IIc), (IId), (IIe), (IIf), (IIg), (IIh), (IIi), (IIj), (III), (IV), (V), (VI) and (VIa) disclosed herein.

In this disclosure, any two numbers of a variable can constitute a workable range of the variable, and any ranges indicated may include or exclude the endpoints.

Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

BRIEF DESCRIPTION OF DRAWINGS

The accompanying drawings, which are included to provide a further understanding of the disclosure and constitute a part of this specification, illustrate exemplary embodiments, and together with the description help to explain the principles of the disclosure. In the drawings

DETAILED DESCRIPTION

Figure 1:
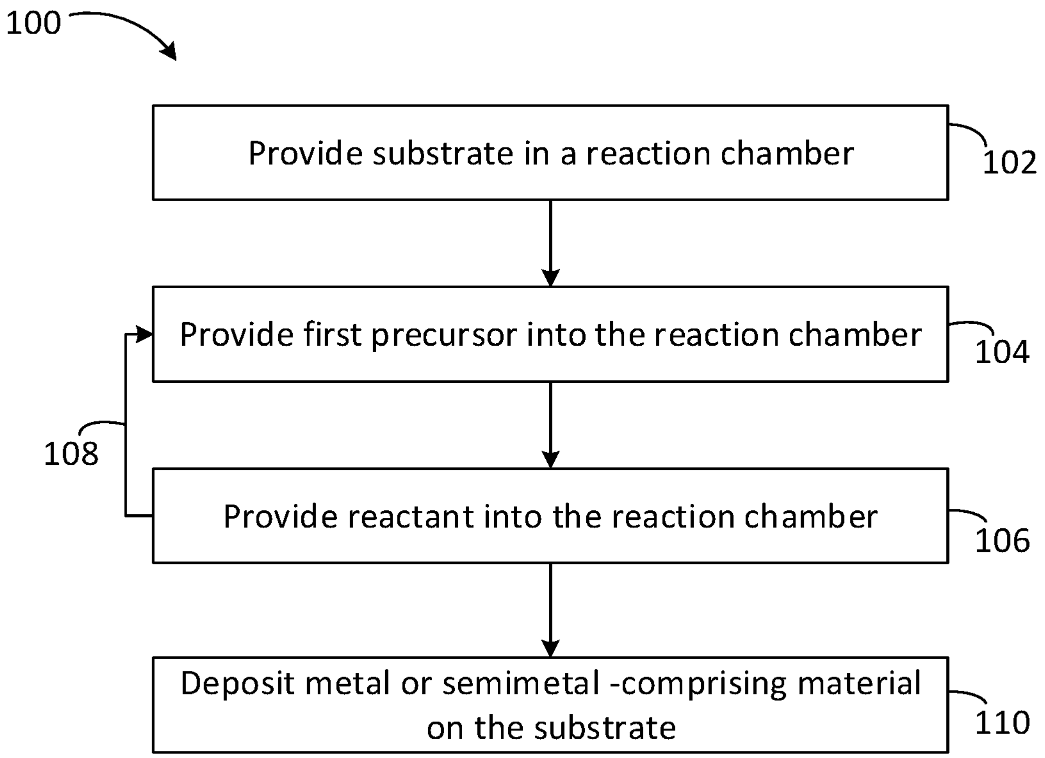
FIG. 1 is a block diagram of exemplary embodiments of a method according to the current disclosure.

The description of exemplary embodiments of compositions, methods and deposition assemblies provided below is merely exemplary and is intended for purposes of illustration only. The following description is not intended to limit the scope of the disclosure or the claims. Moreover, recitation of multiple embodiments having indicated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other. The headings provided herein, if any, are for convenience only and do not necessarily affect the scope or meaning of the claimed invention.

General Process

The current disclosure relates to methods and deposition assemblies for using said compositions and performing said methods. The disclosure further relates to reactant compositions for use in methods of depositing a metal or a semimetal on a substrate.

In one aspect, a method of depositing material comprising a metal on a substrate by a cyclic vapor deposition process is disclosed. The metal is introduced in a first precursor comprising the deposited metal. In some embodiments, the first precursor is a metal precursor. A metal precursor is used to deposit a metal-containing material on the substrate. In some embodiments, the first precursor is a transition metal precursor. Thus, the metal in the first precursor is a transition metal. A transition metal precursor is used to deposit a transition metal-containing material on the substrate. In some embodiments, the first precursor is a main group metal precursor. Thus, the metal in the first precursor is a main group metal. A main group metal precursor is used to deposit a main group metal-containing material on the substrate. A main group metal may be defined as a metal of groups 13, 14, 15 and 16. However, the only metal of group 16 is Po, and for the current purposes, it may be excluded from the definition of a main group metal.

In some embodiments, the metal in the first precursor is selected from group 4, 5 and 6 transition metals Ti, Zr, Hf, V, Nb, Ta, Cr, Mo and W. In some embodiments, the metal in the first precursor is a group 4 transition metal. In some embodiments, the metal in the first precursor is a group 5 transition metal. In some embodiments, the metal in the first precursor is a group 6 transition metal. In some embodiments, the metal in the first precursor is selected from group 7, 8 and 9 transition metals Mn, Re, Fe, Ru, Os, Co, Rh and Ir. In some embodiments, the metal in the first precursor is a group 7 transition metal. In some embodiments, the metal in the first precursor is a group 8 transition metal. In some embodiments, the metal in the first precursor is a group 9 transition metal. In some embodiments, the metal in the first precursor is selected from group 10, 11 and 12 transition metals Ni, Pd, Pt, Cu, Ag, Au and Zn. In some embodiments, the metal in the first precursor is a group 10 transition metal. In some embodiments, the metal in the first precursor is a group 11 transition metal. In some embodiments, the metal in the first precursor is a group 12 transition metal. In some embodiments, the metal in the first precursor is selected from Al, Ga, In, Sn, Pb and Bi.

In a variation of the first aspect of the current disclosure, the deposited material comprises a semimetal. Semimetals according to the current disclosure include boron (B), silicon (Si), germanium (Ge) arsenic (As), antimony (Sb) and tellurium (Te). Thus, in some embodiments, the deposited material comprises a metal or a semimetal. In some embodiments, the first precursor comprises an element selected from a group consisting of Ti, Zr, Hf, V, Nb, Ta, Cr, Mo, W, Mn, Re, Fe, Ru, Os, Co, Rh, Ir, Ni, Pd, Pt, Cu, Ag, Au, Zn, B, Al, Ga, In, Si, Ge, Sn, Pb, Sb, Bi and Te. In some embodiments, the first precursor is a semimetal precursor. A semimetal precursor is used to deposit a semimetal-containing material on the substrate. In some embodiments, the semimetal in the first precursor is selected from a group consisting of B, Si, Ge, Sb and Te. In some embodiments, the semimetal in the first precursor is B. In some embodiments, the semimetal in the first precursor is Si. In some embodiments, the semimetal in the first precursor is Ge. In some embodiments, the semimetal in the first precursor is Sb. In some embodiments, the semimetal in the first precursor is Te.

The deposited material may form a layer comprising a metal. The deposited material may form a layer comprising a semimetal. As used herein, the term "layer" and/or "film" can refer to any continuous or non-continuous structure and material, such as material deposited by the methods disclosed herein. For example, layer and/or film can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous. A seed layer may be a non-continuous layer serving to increase the rate of nucleation of another material. However, the seed layer may also be substantially or completely continuous. A layer of desired thickness may be deposited by repeating providing a first precursor and a reactant in the reaction chamber sufficiently many times. A layer produced according to the methods disclosed herein may form a part of a semiconductor structure and/or a semiconductor device. In some embodiments, a layer deposited by a method according to the current disclosure is substantially continuous.

As used herein, the term "substrate" may refer to any underlying material or materials that may be used to form, or upon which, a device, a circuit, material or a material layer may be formed. The substrate may be continuous or non-continuous; rigid or flexible; solid or porous. The substrate may be in any form such as a powder, a plate, or a workpiece. Substrates in the form of a plate may include wafers in various shapes and sizes. Substrates may be made from materials, such as silicon, silicon germanium, silicon oxide, gallium arsenide, gallium nitride and silicon carbide for example. A substrate can include a bulk material, such as silicon (such as single-crystal silicon), other Group IV materials, such as germanium, or other semiconductor materials, such as a Group II-VI or Group III-V semiconductor materials. A substrate can include one or more layers overlying the bulk material. The substrate can include various topologies, such as gaps, including recesses, lines, trenches or spaces between elevated portions, such as fins, and the like formed within or on at least a portion of a layer of the substrate. Substrate may include nitrides, for example TiN, oxides, insulating materials, dielectric materials, conductive materials, metals, such as such as tungsten, ruthenium, molybdenum, cobalt, aluminum or copper, or metallic materials, crystalline materials, epitaxial, heteroepitaxial, and/or single crystal materials. In some embodiments of the current disclosure, the substrate comprises silicon. The substrate may comprise other materials, as described above, in addition to silicon. The other materials may form layers.

A substrate in the form of a powder may have a potential application for pharmaceutical manufacturing. A porous substrate may comprise polymers. Workpieces may comprise medical devices (i.e. stents, syringes, etc.), jewelry, tooling devices, components for battery manufacturing (i.e. anodes, cathodes, or separators) or components of photovoltaic cells.

In certain embodiments, a continuous substrate may extend beyond the bounds of a process chamber where a deposition process occurs and may move through the process chamber such that the process continues until the end of the substrate is reached. A continuous substrate may be supplied from a continuous substrate feeding system allowing for manufacture and output of the continuous substrate in any appropriate form. Non-limiting examples of a continuous substrate may include a sheet, a non-woven film, a roll, a foil, a web, a flexible material, a bundle of continuous filaments or fibers (i.e. ceramic fibers or polymer fibers). Continuous substrates may also comprise carriers or sheets upon which non-continuous substrates are mounted.

In the current disclosure, the deposition process may comprise a cyclic deposition process, such as an atomic layer deposition (ALD) process or a cyclic chemical vapor deposition (CVD) process. The term "cyclic deposition process" can refer to the sequential introduction of precursor(s) and/or reactant(s) into a reaction chamber to deposit material, such as a metal, a semimetal or a metal nitride, or a semimetal nitride, on a substrate. Cyclic deposition includes processing techniques such as atomic layer deposition (ALD), cyclic chemical vapor deposition (cyclic CVD), and hybrid cyclic deposition processes that include an ALD component and a cyclic CVD component. The process may comprise a purge step between providing precursors or between providing a precursor and a reactant in the reaction chamber.

The process may comprise one or more cyclic phases. For example, pulsing of a first precursor and a reactant may be repeated. Repeating the cyclic deposition steps may be used to control the thickness of the deposited material. In some embodiments, the process comprises or one or more acyclic phases. In some embodiments, the deposition process comprises the continuous flow of at least one precursor. In some embodiments, a reactant may be continuously provided in the reaction chamber. In such an embodiment, the process comprises a continuous flow of a precursor or a reactant. In some embodiments, one or more of the precursors and/or reactants are provided in the reaction chamber continuously. A cyclic deposition process may usually be initiated with any of at least two precursors and/or reactants used in the process. Thus, in the current methods, the first deposition cycle may be started by providing either a first precursor or a second precursor/reactant into the reaction chamber.

The term "atomic layer deposition" (ALD) can refer to a vapor deposition process in which deposition cycles, such as a plurality of consecutive deposition cycles, are conducted in a reaction chamber. The term atomic layer deposition, as used herein, is also meant to include processes designated by related terms, such as chemical vapor atomic layer deposition, when performed with alternating pulses of precursor(s)/reactant(s), and optional purge gas(es). Generally, for ALD processes, during each cycle, a precursor is introduced to a reaction chamber and is chemisorbed to a deposition surface (e.g., a substrate surface that may include a previously deposited material from a previous ALD cycle or other material), forming about a monolayer or submonolayer of material that does not readily react with additional precursor (i.e., a self-limiting reaction). Thereafter, in some cases, another precursor or a reactant may subsequently be introduced into the process chamber for use in converting the chemisorbed precursor to the desired material on the deposition surface. The second precursor or a reactant can be capable of further reaction with the precursor. Purging steps may be utilized during one or more cycles, e.g., during each step of each cycle, to remove any excess precursor from the process chamber and/or remove any excess reactant and/or reaction byproducts from the reaction chamber. Thus, in some embodiments, the cyclic deposition process comprises purging the reaction chamber after providing a precursor into the reaction chamber. In some embodiments, the cyclic deposition process comprises purging the reaction chamber after providing a first precursor into the reaction chamber. In some embodiments, the cyclic deposition process comprises purging the reaction chamber after providing a reactant into the reaction chamber. In some embodiments, the cyclic deposition process comprises purging the reaction chamber after providing each precursor into the reaction chamber.

CVD type processes typically involve gas phase reactions between two or more precursors and/or reactants. The precursor(s) and reactant(s) can be provided simultaneously to the reaction space or substrate, or in partially or completely separated pulses. The substrate and/or reaction space can be heated to promote the reaction between the gaseous precursor and/or reactants. In some embodiments the precursor(s) and reactant(s) are provided until a layer having a desired thickness is deposited. In some embodiments, cyclic CVD processes can be used with multiple cycles to deposit a thin film having a desired thickness. In cyclic CVD processes, the precursors and/or reactants may be provided to the reaction chamber in pulses that do not overlap, or that partially or completely overlap.

As used herein, the term "purge" may refer to a procedure in which vapor phase precursors and/or vapor phase byproducts are removed from the substrate surface for example by evacuating the reaction chamber with a vacuum pump and/or by replacing the gas inside a reaction chamber with an inert or substantially inert gas such as argon or nitrogen. Purging may be effected between two pulses of gases which react with each other. However, purging may be effected between two pulses of gases that do not react with each other. For example, a purge, or purging may be provided between pulses of two precursors or between a precursor and a reactant. Purging may avoid or at least reduce gas-phase interactions between the two gases reacting with each other. It shall be understood that a purge can be effected either in time or in space, or both. For example in the case of temporal purges, a purge step can be used e.g., in the temporal sequence of providing a first precursor to a reactor chamber, providing a purge gas to the reactor chamber, and providing a reactant to the reactor chamber, wherein the substrate on which a layer is deposited does not move. For example in the case of spatial purges, a purge step can take the following form: moving a substrate from a first location to which a first precursor is continually supplied, through a purge gas curtain, to a second location to which a reactant is continually supplied. Purging times may be, for example, from about 0.01 seconds to about 20 seconds, from about 0.05 s to about 20 s, or from about 1 s to about 20 s, or from about 0.5 s to about 10 s, or between about 1 s and about 7 seconds, such as 1 s or 2 s. However, other purge times can be utilized if necessary, such as where highly conformal step coverage over extremely high aspect ratio structures or other structures with complex surface morphology is needed, or in specific reactor types, such as a batch reactor, may be used.

In some embodiments, the cyclic deposition process according to the current disclosure comprises a thermal deposition process. In thermal deposition, the chemical reactions may be promoted by increased temperature relevant to ambient temperature. Generally, temperature increase may provide the energy needed for the formation of the deposited material. In some embodiments, the current disclosure does not comprise using plasma. However, in the deposition processes according to the current disclosure, a reactant is selected to enhance the reactivity of the precursors forming the deposited material. Without limiting the current disclosure to any specific theory, the reactant may generate a radical species driving the deposition reaction. The reactivity of a radical species may allow the use of lower deposition temperatures, it may increase the rate of deposition, or both. Such advantages may, in turn, enable the use of novel precursors whose limited thermal stability, for example, may be otherwise prohibitive. A reactant according to the current disclosure may be a radical-generating reactant.

The method according to the current disclosure comprises providing a substrate in a reaction chamber. The reaction chamber may form a part of a semiconductor processing assembly, such as a vapor deposition assembly. The reaction chamber can form part of an atomic layer deposition (ALD) assembly. The reaction chamber can form part of a chemical vapor deposition (CVD) assembly. The assembly may be a single wafer reactor. Alternatively, the reactor may be a batch reactor. The assembly may comprise one or more multi-station deposition chambers. In some embodiments, the method according to the current disclosure is performed in a single reaction chamber of a cluster tool, but other, preceding or subsequent, manufacturing steps of the structure or device may be performed in additional reaction chambers of the same cluster tool. Optionally, an assembly including the reaction chamber can be provided with a heater to activate the reactions by elevating the temperature of one or more of the substrate and/or the reactants and/or precursors.

First Precursor

The terms "precursor" and "reactant" can refer to molecules (compounds or molecules comprising a single element) that participate in a chemical reaction that produces another compound. A precursor typically contains portions that are at least partly incorporated into the compound or element resulting from the chemical reaction in question. Such a resulting compound or element may be deposited on a substrate. A reactant may be an element or a compound that is not incorporated into the resulting compound or element to a significant extent. However, a reactant may also contribute to the resulting compound or element in certain embodiments. In the current disclosure a "reactant" refers to any of compounds I to VI.

As used herein, a "first precursor" includes a gas or a material that can become gaseous and that can be represented by a chemical formula that includes a metal or a semimetal. The first precursor may be solid, liquid or gaseous under standard conditions. In some embodiments, the first precursor is a metal precursor comprising at least one organic ligand. In some embodiments, the first precursor is a metalorganic metal precursor. In some embodiments, the first precursor is a semimetal precursor comprising at least one organic ligand. In some embodiments, the first precursor comprises a ligand selected from a group consisting of beta-diketonate (such as tris(2,2,6,6-tetramethyl-3,5-heptanedionato) tmhd), amidinate, such as acetamindinate (amd), amidate, carbonyl (CO), cyclopentadienyl (Cp), halide (such as chloride, bromide or fluoride), alkyl (such as methyl (Me), sec-butyl ($^sBu$), tert-butyl ($^tBu$)), alkylamide, alkylimido (=N—), alkoxide (such as isopropoxide (OiPr)), allyl, arene, diazadiene, acetate (Ac), dialkylaminoalkoxide and hexamethyldisilazido.

In some embodiments, the first precursor is selected from a group consisting of $W(CO)_6$, $Cr(CO)_6$, $GaMe_3$, $Mo(CO)_6$, $Mo(tmhd)_3$, $Mo(=N^tBu)_2(NMe_2)_2$. $CpCo(CO)_2$, $RuCp_2$, $Cu(dmap)_2$, $Mo(NMe_2)_4$, $MoCp(CO)_2(NO)$, $MoCl_5$, $MoF_6$, $MO_2(Ac)_4$, $Mo(OiPr)_4$, $Co(amd)_2$, $Co[N(SiMe_3)_2]_2$. In some embodiments, the first precursors is selected from a group consisting of $H_3SiN(SiH_3)_2$, $N(SiH_3)_3$, Tris(trimethylsilyl) silylhydrazine, $(^sBu_2N)SiH_3$, $B(NMe_2)_3$, borazine and $B_2H_6$.

In some embodiments, the first precursor is a homoleptic precursor comprising at least two identical ligands. In some embodiments, the first precursor is a heteroleptic precursor comprising at least two different ligands.

In some embodiments, a first precursor is provided in a mixture of two or more compounds. In a mixture, the other compounds in addition to the first precursor may be inert compounds or elements. In some embodiments, first precursor is provided in a composition. Compositions suitable for use as composition can include a metal or a semimetal containing compound and an effective amount of one or more stabilizing agents. Composition may be solid, a solution or a gas in standard conditions. In some embodiments, the first precursor is heated before providing it to the reaction chamber. In some embodiments, the first precursor vessel is kept at a first temperature, the precursor injection system is kept at a second temperature, and the reaction chamber is kept at a third temperature. In some embodiments, for the first precursor, the first temperature and the second temperature are the same. The third temperature may be the same or different than the first and second temperatures. In some embodiments, the third temperature is higher than the first temperature. The temperatures to which the first precursor is heated depend on the properties of the first precursor. Remember to extend the temperature regime into all the embodiments of the disclosure.

Reactant

The material comprising a metal or a semimetal is formed by providing a reactant into the reaction chamber in a vapor phase. In some embodiments, the reactant is a radical-generating reactant. The conversion of a first precursor to the desired material comprising metal or semimetal may take place at the substrate surface. In some embodiments, the conversion may take place at least partially in the gas phase. In some embodiments, the reactions between the first precursor and the reactant take place substantially only on the surface of the substrate. Especially in embodiments, in which the first precursor and the reactant are provided into the reaction chamber alternately and sequentially, the surface reactions are strongly favored. This may lead to reduced, i.e. controllable, rate of deposition, and to conformality of the deposited materials. In some embodiments, the cyclic deposition process comprises providing the first precursor and the reactant alternately and sequentially into the reaction chamber. The prevalence of surface reactions may be further enhanced by purging the reaction chamber between providing the first precursor and the reactant into the reaction chamber, as explained above. In some embodiments, the reaction chamber is purged between providing the first precursor and the reactant into the reaction chamber.

It may be envisaged that the reactants disclosed herein comprise a structure in which the reactant becomes cleaved through homolytic cleavage such that each of the resulting cleavage products is a radical species. In the current disclosure, a radical species is to be understood as a compound comprising an unpaired electron. The reactivity of a radical species may depend on its molecular context. The reactants, such as radical-generating reactants, disclosed herein are designed to have a high probability of being cleaved in a manner producing a reactive radical species and a long-lived radical. A reactive radical species is reactive, i.e. it reacts strongly and/or fast with molecules it becomes in contact with. A long-lived radical, however, reacts more slowly in a time frame of an ALD reaction. In some embodiments, the long-lived radical is self-quenched. In some embodiments, the long-lived radical is a stable radical, i.e. it exists long enough to be isolated. In some embodiments, the long-lived radical is a persistent radical, i.e. it has a long lifetime for a radical species, but not long enough to be isolated. In some embodiments, the lifetime of the long-lived radical is on the order of seconds or minutes. A reactive radical species according to the current disclosure is an H• radical or an $NH_2$~ radical. A "•" designates an unpaired electron in the current disclosure.

Thus, the reactive radical species is favored in reacting with the first precursor. It is to be understood that the reactive radical species may react with the first precursor or with a derivative thereof present in the reaction chamber. The reaction may take place on the substrate surface or in gas-phase or both, depending on the process parameters. The larger the difference in the reactivity of the two radicals is, the more strongly the reaction of the reactive radical species with the first precursor is favored. In an ideal situation, the long-lived radical species would have a near-zero reactivity towards the first precursor—and possibly towards any other molecules present in the reaction chamber. However, even moderately reactive radical species may be tolerated as the long-lived radical species. The reaction conditions, including temperature, pulsing time, reactant concentration, purging time and gas flow rates, may be adjusted to suit the chemistry in question. For clarity, the possible radical route of reacting is not dependent so much on the absolute reactivities of the reactive radical species and the long-lived radical, as the difference in their reactivities under the processing conditions in question.

A reactant may thus release a reactive radical species and a long-lived radical species in the reaction chamber. In some embodiments, the release of the two radicals, or the cleavage of the reactant into a reactive radical species and a long-lived radical species, may be temperature dependent. Thus, the reactant may be stable under storage conditions, and in the vessel containing the first precursor before being delivered into the reaction chamber. In some embodiments, the deposition is performed at a temperature that is higher than the temperature of the precursor injection system and the reactant vessel. In some embodiments, the deposition is performed at a temperature that is higher than about 20° C., higher than about 50° C., or higher than about 100° C. In some embodiments, the deposition is performed at a temperature that is lower than about 400° C., lower than about 350° C., lower than about 300° C. or lower than about 250° C. In some embodiments, the deposition is performed at a temperature that is between about 120° C. and about 350° C., such as between about 150° C. and about 250° C. or between about 150° C. and about 200° C. The properties of the first precursor and the reactant will be considered in selecting the temperature for deposition. It is to be appreciated that not all first precursor and reactant may have a compatible functional temperature.

In some embodiments, a reactant is heated to at least 20° C., to at least 40° C., or to at least 60° C., or to at least 80° C. or to at least 100° C. or to at least 110° C. before providing it to the reaction chamber. The heating may take place in a precursor vessel. In some embodiments, the reactant is heated to at most 150° C., or to at most 100° C., or to at most 80° C., or to at most 60° C. before providing it to the reaction chamber. In some embodiments, the temperature of the reactant is regulated to be between about 10° C. and about 200° C., such as between about 20° C. and about 150° C., between about 25° C. and about 100° C. or between about 25° C. and about 60° C. The injector system of a vapor deposition assembly may be heated to improve the vapor-phase delivery of the reactant to the reaction chamber. The temperature of the reaction chamber is higher than the temperature of the reactant.

In some embodiments, the reactant is cooled. In some embodiments, the reactant is cooled before providing it to a reaction chamber. In some embodiments, the reactant is cooled to a temperature of below about 40° C., below about 30° C., below about 25° C., below about 20° C., below about 10° C. or below about 0° C.

In some embodiments, the reactant is a reducing agent. A reducing agent may reduce the metal or a semimetal of the first precursor into elemental metal. The reduction may be a result of a radical reaction. In some embodiments, a material comprising, consisting essentially of, or consisting of, elemental metal is deposited. Examples of elemental metals that may be deposited by the methods according to the current disclosure include Li, Sc, Y, La, Ti, Zr, Hf, V, Nb, Ta, Cr, Mo, W, Mn, Re, Fe, Ru, Os, Co, Rh, Ir, Ni, Pd, Pt, Cu, Ag, Au, Zn, Al, Ga, In, Sn and Bi.

In some embodiments, the reactant is a nitrogen precursor. In such embodiments, a material deposited according to the current disclosure comprises nitrogen. In some embodiments, the nitrogen-comprising material is a metal nitride. In some embodiments, the reactant is a nitrogen precursor, and the material comprising a metal or semimetal comprises a metal nitride. In some embodiments, the nitrogen-comprising material comprises a semimetal nitride. In some embodiments, the reactant is a nitrogen precursor, and the metal or semimetal-containing material comprises a semimetal nitride. Metal and semimetal nitrides may exist in various phases. It depends on the process specifics which phase(s) will be formed during deposition. For clarity, a metal or semimetal nitride according to the current disclosure can mean any phase or mixture of phases. Examples of metal nitrides that may be deposited by the methods according to the current disclosure include lithium nitride, scandium nitride, yttrium nitride, lanthanum nitride, titanium nitride, zirconium nitride, hafnium nitride, vanadium nitride, niobium nitride, tantalum nitride, chromium nitride, molybdenum nitride, tungsten nitride, cobalt nitride, rhenium nitride, iridium nitride, nickel nitride, copper nitride, zinc nitride, aluminum nitride, gallium nitride, indium nitride and tin nitride. Examples of semimetal nitrides that may be deposited by the methods according to the current disclosure include boron nitride, silicon nitride, germanium nitride. The term nitride is to be understood to include various forms and elemental proportions of compounds containing a metal or a semimetal and nitrogen. In some embodiments, a metal nitride or a semimetal nitride comprises additional elements, such as carbon and/or oxygen.

Similarly to the first precursor, a reactant, such as a radical-generating reactant, may be heated before providing it to the reaction chamber. In some embodiments, the reactant is heated before providing it to the reaction chamber. In some embodiments, the reactant vessel is kept at a first temperature, the precursor injection system is kept at a second temperature, and the reaction chamber is kept at a third temperature. The first temperature may be termed the vaporization temperature. It is selected to afford sufficient volatilization of the first precursor or the reactant, while avoiding the degradation or premature radical release of the first precursor or the reactant. In some embodiments, for the reactant, the first temperature, the second temperature are the same. In some embodiments, for the reactant, the first temperature and the second temperature are different. For example, the second temperature may be higher than the first temperature. The third temperature may be the same or different than the first and second temperatures. In some embodiments, the third temperature is higher than the first temperature. In some embodiments, the third temperature is higher than the second temperature. In some embodiments, the third temperature is higher than the first temperature and the second temperature. The temperatures to which the reactant is heated depend on the properties of the reactant. Especially, the reactant may release a reactive radical species more readily at higher temperatures. Thus, the first temperature may be selected so as to minimize the premature release of the reactive radical species. In other words, temperature of a source vessel holding the reactant is below the temperature at which the reactant forms radicals. However, the temperature of the reactant vessel is suitably high for vaporization of the reactant.

The second temperature may be higher than the first temperature to prepare the reactant for quick release of the reactive radical species in the reaction chamber. In some embodiments, release of a reactive radical species may initiate already in the precursor injection system. In some embodiments, the third temperature is selected so that the reactive radical species is released at a sufficient rate to react with the first precursor in the reaction chamber. In some embodiments, the temperature in the reaction chamber is higher than the vaporization temperature of the reactant. As is understood by those skilled in the art, the vaporization temperatures of the reactant and the reactant may need to be compatible.

In this disclosure, "gas" can include material that is a gas at normal temperature and pressure (NTP), a vaporized solid and/or a vaporized liquid, and can be constituted by a single gas or a mixture of gases, depending on the context. A precursor or a reactant may be provided to the reaction chamber in gas phase. A reactant may be provided to the reaction chamber in gas phase. The term "inert gas" can refer to a gas that does not take part in a chemical reaction and/or does not become a part of a layer to an appreciable extent. Exemplary inert gases include He and Ar and any combination thereof. In some cases, molecular nitrogen and/or hydrogen can be an inert gas. A gas other than a process gas, i.e., a gas introduced without passing through a precursor injector system, other gas distribution device, or the like, can be used for, e.g., sealing the reaction space, and can include a seal gas.

In some embodiments, the reactant is a radical-generating reactant. In some embodiments, the reactant is a radical-generating reactant, and it releases a reactive radical species and a long-lived radical species. The reactive radical species may react with the first precursor to form material comprising the metal or the semimetal on the substrate. In some embodiments, the reactive radical species is released substantially only under the conditions in the reaction chamber. Thus, the radical-releasing reactant is inert, or substantially inert, in the reactant vessel. The radical-releasing reactant may therefore be activated by providing it to the reaction chamber. The specific activation conditions may be determined by the skilled person in view of the properties of the reactant and process.

In some embodiments, the reactant is a radical-generating reactant and the reactive radical species released by the radical-generating reactant is selected from a group consisting of H• and $NH_2$•. An H• radical may be generated from, for example, an —OH group attached to an N atom, which is further bonded to two carbon atoms. An alternative chemistry generating a hydrogen radical (H•) is a hydrogen atom bonded to a silicon or to a phosphorus atom. However, the suitable reactivity of the above structures is achieved only in an appropriate atomic environment, possibly allowing the release of hydrogen with an unpaired electron. An H• radical is a very fast-reacting radical and may result in the deposition of material comprising elemental metal or elemental semimetal. In some embodiments, the radical-generating reactant releases a hydrogen radical (H•), and the material comprising a metal deposited on the substrate is an elemental metal.

In some embodiments, the deposited metal is a transition metal. In some embodiments, the deposited metal is a main group metal. In some embodiments, the deposited metal is selected from group 4, 5 and 6 transition metals Ti, Zr, Hf, V, Nb, Ta, Cr, Mo and W. In some embodiments, the deposited metal is selected from group 7, 8 and 9 transition metals Mn, Re, Fe, Ru, Os, Co, Rh and Ir. In some embodiments, the deposited metal is selected from group 10, 11 and 12 transition metals Ni, Pd, Pt, Cu, Ag, Au and Zn. In some embodiments, the deposited metal is selected from Al, Ga, In, Sn, Pb and Bi. In some embodiments, the deposited metal is selected from a group consisting of Ti, Zr, Hf, V, Nb, Ta, Cr, Mo, W, Mn, Re, Fe, Ru, Os, Co, Rh, Ir, Ni, Pd, Pt, Cu, Ag, Au, Zn, Al, Ga, In, Sn, Pb, Bi and Te. In some embodiments, the deposited metal is a noble metal. In some embodiments, the deposited metal is selected from a group consisting of Ag, Au, Ta, Ti, Ge, Zn and Gd. In some embodiments, the deposited metal is selected from a group consisting of V, Mo, W, Re, Ru, Co, Ni, Pd, Pt and Cu. In some embodiments, the radical-generating reactant releases a hydrogen radical (H.), and the material comprising a semimetal deposited on the substrate is an elemental semimetal. The deposited semimetal according to the current disclosure is selected from a group consisting of Si, Ge, Sb and Te.

The reactions of an $NH_2$• radical may lead into the incorporation of nitrogen in the material. The $NH_2$• radical can therefore be used for depositing a nitride-containing material, such as a metal nitride or a semimetal nitride. A metal nitride according to the current disclosure may be, for example, lithium nitride, scandium nitride, yttrium nitride, lanthanum nitride, titanium nitride, zirconium nitride, vanadium nitride, niobium nitride, tantalum nitride, chromium nitride, molybdenum nitride, tungsten nitride, manganese nitride, rhenium nitride, boron nitride, gallium nitride, silicon nitride, aluminum nitride, indium nitride. Thus, in some embodiments, the radical-generating reactant releases an amino radical ($NH_2$•), and the material comprising a metal deposited on the substrate comprises nitrogen.

EXEMPLARY EMBODIMENTS OF A REACTANT

In some embodiments, the reactant according to the current disclosure, such as a radical-generating reactant, comprises a compound of formula (I), (I)

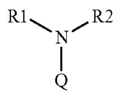

wherein R1 and R2 are the same or different, and independently selected from H, linear and branched alkyl groups, each comprising at least two carbon atoms, and silyl groups and Q is —OH or —$NH_2$. In some embodiments, the silyl group is selected from $SiH_3$, $SiH_2(CH_3)$, $SiH(CH_3)_2$ and $Si(CH_3)_3$. In embodiments, in which Q is —OH, the released radical may be a hydrogen radical and the deposited material may comprise an elemental metal or a semimetal. In embodiments, in which Q is —$NH_2$, the released radical may be an amino radical and the deposited material may comprise a nitrogen compound, such as a metal nitride or a semimetal nitride. In some embodiments, only one of R1 and R2 is H. In other words, in some embodiments, both R1 and R2 are not simultaneously H. Especially, in embodiments, in which Q is —$NH_2$, only one of R1 and R2 may be H. In some embodiments, R1 and R2 are both alkyl groups. In some embodiments, both R1 and R2 are branched alkyl groups. In some embodiments, R1 and R2 are both linear alkyl groups.

In some embodiments, both R1 and R2 are alkyl groups comprising at least 2 carbon atoms. In some embodiments, both R1 and R2 are alkyl groups comprising at least 3 carbon atoms. In some embodiments, both R1 and R2 are alkyl groups comprising at least 4 carbon atoms. In some embodiments, both R1 and R2 are alkyl groups comprising at least 5 carbon atoms. In some embodiments, both R1 and R2 are alkyl groups comprising at most 2 carbon atoms. In some embodiments, both R1 and R2 are alkyl groups comprising at most 3 carbon atoms. In some embodiments, both R1 and R2 are alkyl groups comprising at most 4 carbon atoms. In some embodiments, both R1 and R2 are alkyl groups comprising at most 5 carbon atoms. In some embodiments, both R1 and R2 are alkyl groups comprising at most 6 carbon atoms. In some embodiments, both R1 and R2 are alkyl groups comprising 2 carbon atoms. In some embodiments, both R1 and R2 are alkyl groups comprising 3 carbon atoms. In some embodiments, both R1 and R2 are alkyl groups comprising 4 carbon atoms. In some embodiments, both R1 and R2 are alkyl groups comprising 5 carbon atoms. In some embodiments, both R1 and R2 are alkyl groups comprising 6 carbon atoms.

In some embodiments, R1 and R2 are identical alkyl groups. In some embodiments, R1 and R2 are identical alkyl groups comprising at least 2 carbon atoms. In some embodiments, R1 and R2 are identical alkyl groups comprising at least 3 carbon atoms. In some embodiments, R1 and R2 are identical alkyl groups comprising at least 4 carbon atoms. In some embodiments, R1 and R2 are identical alkyl groups comprising at least 5 carbon atoms. In some embodiments, R1 and R2 are identical alkyl groups comprising at most 2 carbon atoms. In some embodiments, R1 and R2 are identical alkyl groups comprising at most 3 carbon atoms. In some embodiments, R1 and R2 are identical alkyl groups comprising at most 4 carbon atoms. In some embodiments, R1 and R2 are identical alkyl groups comprising at most 5 carbon atoms. In some embodiments, R1 and R2 are identical alkyl groups comprising 2 carbon atoms. In some embodiments, R1 and R2 are identical alkyl groups comprising 3 carbon atoms. In some embodiments, R1 and R2 are identical alkyl groups comprising 4 carbon atoms. In some embodiments, R1 and R2 are identical alkyl groups comprising 5 carbon atoms. In some embodiments, R1 and R2 are identical alkyl groups comprising 6 carbon atoms.

In some embodiments, at least one of R1 and R2 is an ethyl group. In some embodiments, at least one of R1 and R2 is a propyl group, such as n-propyl or isopropyl. In some embodiments, at least one of R1 and R2 is a butyl group, such as n-butyl, sec-butyl, isobutyl or tert-butyl. In some embodiments, at least one of R1 and R2 is a pentyl group, such as n-pentyl, tert-pentyl, neopentyl, isopentyl (3-methylbutyl), sec-pentyl, 3-pentyl, sec-isopentyl or 2-methylbutyl. In some embodiments, both R1 and R2 are an ethyl group. In some embodiments, both R1 and R2 are a propyl group, such as n-propyl or isopropyl. In some embodiments, both R1 and R2 are a butyl group, such as n-butyl, sec-butyl, isobutyl or tert-butyl. In some embodiments, both R1 and R2 are a pentyl group, such as n-pentyl, tert-pentyl, neopentyl, isopentyl (3-methylbutyl), sec-pentyl, 3-pentyl, sec-isopentyl or 2-methylbutyl.

In embodiments, in which the compound of formula (I) is a radical-generating reactant, the long-lived radical released by the radical-generating reactant may comprise at least four carbon atoms. In embodiments, in which the compound of formula (I) is a radical-generating reactant, the long-lived radical released by the radical-generating reactant may comprise at least one silicon atom, such as two, three, four, five or six silicon atoms. In some embodiments, the long-lived radical released by the radical-generating reactant comprises at least eight carbon atoms. An —OH group present in a radical-generating reactant may release an H• radical. An —$NH_2$ group present in a radical-generating reactant may release an $NH_2$• radical.

In some embodiments, the reactant comprises a compound of formula of (Ia). In some embodiments, OH group of compound (Ia) may be replaced with an $NH_2$ group.

(Ia)

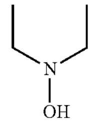

In some embodiments, the reactant comprises a compound of formula (Ib). In some embodiments, $NH_2$ group of compound (Ib) may be replaced with an OH group.

(Ib)

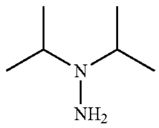

In some embodiments, the reactant comprises a compound of formula (Ic). In some embodiments, $NH_2$ group of compound (Ic) may be replaced with an OH group.

(Ic)

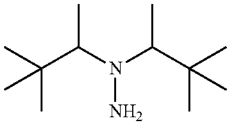

In some embodiments, R1 and R2 together form a ring structure. Thus, in some embodiments, R1 and R2 connect to form a ring structure. In some embodiments, the ring structure comprises nitrogen and four carbon atoms. In some embodiments, the ring structure comprises nitrogen and five carbon atoms. A ring structure may have various advantages over reactants comprising acyclic alkyl groups. For example, the volatility of cyclic compounds may be better compared to acyclic compounds of similar molecular weight and the deposited materials may contain less impurities. In embodiments, in which the reactant generates a long-lived radical species and a reactive radical species, the ring may control the steric interaction between the radical species. A ring system can further act as a delocalized reservoir for the unpaired electron (e.g., diazaphospholenes), which further stabilizes the long-lived radical and weakens the bond being cleaved during radical formation.

In some embodiments, the ring structure comprises a double bond between two carbon atoms.

In some embodiments, the reactant, such as a radical-generating reactant, comprises a compound of formula ($I_d$) to ($I_g$), wherein each of R1 to R8 may be independently selected from H and linear or branched C1 to C3 alkyl groups similarly to the ones described above for formula (I).

(Id)

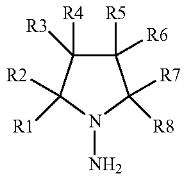

(Ie)

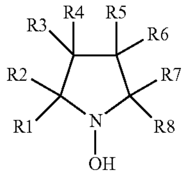

(If)

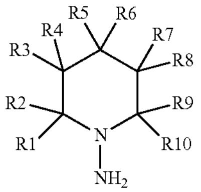

(Ig)

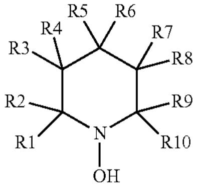

As specific examples, a reactant, such as a radical-generating reactant, may comprise a compound of any of formulas (Ih) to (Io).

(Ih)

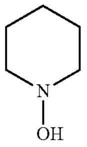

(Ii)

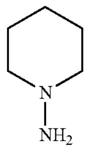

-continued (Ij)

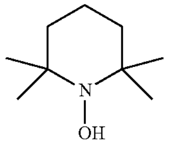

(Ik)

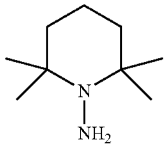

(Il)

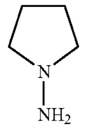

(Im)

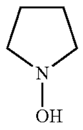

(In)

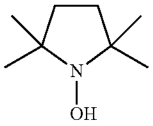

(Io)

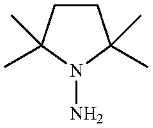

In some embodiments, the ring structure may comprise two rings, as depicted for the exemplary compound of formula (Ip). Although not depicted in the formula, the rings may contain one or more alkyl substituents. In some embodiments, $NH_2$ group of compound (Ip) may be replaced with an OH group.

(Ip)

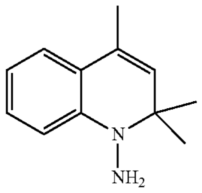

In certain aspects, a compound comprising a hydrogen atom boned to a phosphorus atom, which in its turn is bonded to two nitrogen atoms, may serve as a reactant according to the current disclosure. In some embodiments, the reactant is a radical-generating reactant. In some embodiments, the deposited material comprises an elemental metal. In some embodiments, the metal mostly in elemental form. In some embodiments, the metal is substantially completely in elemental form. In certain other aspects, a compound comprising a $NH_2$ group bonded to a phosphorus atom, which in its turn is bonded to two nitrogen atoms, may serve as a reactant according to the current disclosure.

In some embodiments, the reactant is a radical-generating reactant. In some embodiments, the deposited material comprises a metal nitride. Thus, in yet another aspect, a method of depositing a material comprising a metal or a semimetal on a substrate is disclosed. The method comprises providing a substrate in a reaction chamber, providing a first precursor into the reaction chamber in a vapor phase, and providing a reactant into the reaction chamber in a vapor phase to deposit the material comprising the metal or the semimetal on the substrate. The reactant comprises a compound of formula (II), (II)

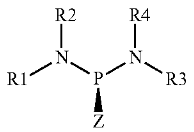

wherein each of R1, R2, R3 and R4 are independently selected from H, linear and branched C1 to C6 alkyl groups and silyl groups, and wherein Z is selected from H and $NH_2$. An $-NH_2$ group present in the position Z in a radical-generating reactant may release an $NH_2$• radical. An —H present in the position Z in a radical-generating reactant may release an H• radical. In some embodiments, at least one of R1 to R4 is selected from a group consisting of silyl, monoalkylsilyl, dialkylsilyl and trialkylsilyl. Examples of silyls groups, including alkylsilyl groups, include $SiH_3$, $SiH_2Me$, $SiHMe_2$, $SiMe_3$, $SiH_2Et$, $SiHEt_2$, $SiEt_3$, $SiH_2Pr$, $SiHPr_2$, $SiPr_3$, $SiH_2iPr$, $SiHiPr_2$, $SiiPr_3$, wherein Me stands for methyl, Et for ethyl, Pr for propyl and iPr for isopropyl.

The linear and branched C1 to C6 alkyl groups are as described above for compounds of formula (I). In some embodiments, R1 and R3 are independently selected from tertiary alkyls and silyl groups. Exemplary alkyl groups include tert-butyl and tert-pentyl. Exemplary silyl groups include trimethylsilyl, supersilyl ($Si(SiMe_3)_3$) and hypersilyl ($Si(Si(SiMe_3)_3)_3$). In some embodiments, R1 and R3 are a tert-butyl group, as depicted in formula ($II_a$).

(IIa)

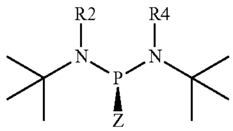

In some embodiments, R1 and R3 are independently selected from fluorinated alkyls, such as $CF_3$, aryls, such as phenyl, fluorinated aryls, such as pentafluorophenyl, amines, such as hydrazine, and boryls, such as 9-borabicyclo[3.3.1] nonane (9-BBN).

In some embodiments, R2 and R4 are alkyls and connect to form a ring with the nitrogen and phosphorus atoms, as indicated in formulas (IIb) and (IIc).

(IIb)

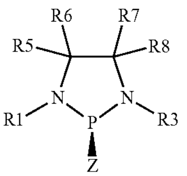

-continued (IIc)

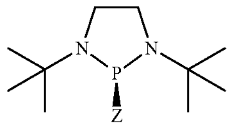

In some embodiments, Z is H. In some embodiments, Z is $NH_2$. The ring may have various substituents, depicted by R5 to R8, which can each independently be selected from H, silyls and C1 to C4 linear and branched alkyls.

In some embodiments, the ring formed by R2 and R4 comprises at least one double bond, as presented for compounds of formulas ($II_d$) and ($II_e$).

(IId)

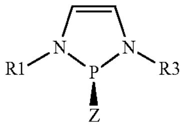

(IIe)

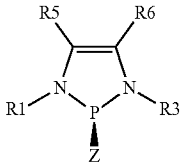

Two exemplary compounds are illustrated in formulas ($II_f$) and ($II_g$). In the depicted molecules, Z is H. However, in some embodiments, the reactant comprises a compound otherwise as in ($II_f$) and ($II_g$), wherein Z is $NH_2$.

(IIf)

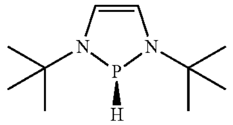

(IIg)

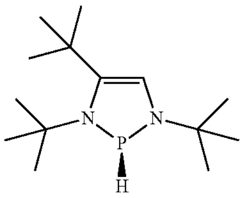

As indicated above, the phosphorus-comprising reactant may comprise a silyl group as one of R2 and R4. In the embodiment of a reactant according to the current disclosure depicted in formula (IIh), R2 and R4 are connected to form a ring through a silyl group. Specifically, the two nitrogen atoms are bridged by the silicon atom. In some embodiments, the bridging silyl group is dimethylsilyl. As above, Z may be H or $NH_2$.

(IIh)

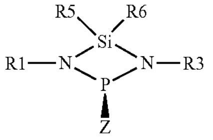

An exemplary embodiment of a compound of formula IIh is the compound of formula ($II_i$), in which R1 and R3 are tert-butyl groups, and the bridging silyl is dimethylsilyl ($Si(CH_3)_2$).

(IIi)

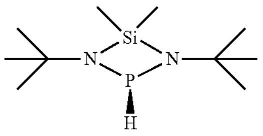

In an aspect, a method of depositing material comprising a metal or semimetal on a substrate is disclosed. The method comprises providing a substrate in a reaction chamber, providing a first precursor into the reaction chamber in a vapor phase, and providing a reactant into the reaction chamber in a vapor phase to deposit the material comprising the metal or semimetal on the substrate, wherein the reactant comprises a compound of formula (III);

(III)

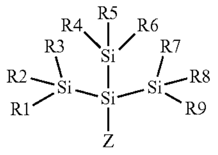

wherein each R1 to R9 is independently selected from H and C1 to C3 alkyl groups, and Z is selected from H, $NH_2$ and $NH—NH_2$.

In an aspect, a method of depositing material comprising a metal or semimetal on a substrate is disclosed. The method comprises providing a substrate in a reaction chamber, providing a first precursor into the reaction chamber in a vapor phase, and providing a reactant into the reaction chamber in a vapor phase to deposit the material comprising the metal or semimetal on the substrate, wherein the reactant comprises a compound of formula (IV). R1 and R2 are independently selected from linear and branched C2 to C6 alkyl groups, and R3 to R6 from H and linear and branched C1 to C6 alkyl groups.

(IV)

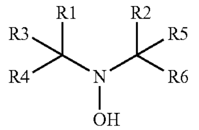

In some embodiments, R1 and R2 form a 5- or 6-membered ring together with the nitrogen atom. For example, an embodiment of a compound of formula (IV) is phenylhydroxylamine. In some embodiments, the deposited material comprises an elemental metal. In some embodiments, the metal mostly in elemental form. In some embodiments, the metal is substantially completely in elemental form. Further, in some embodiments, a simple hydroxylamine, such as methylhydroxylamine (Me—NH—OH) may be used. In some embodiments, the reactant may comprise dimethylhydroxylamine ($(Me)_2N—OH$) or other smaller hydroxylamines, such as methylethylhydroxylamine (MeEt-N—OH)

In an aspect, a method of depositing material comprising a metal or semimetal on a substrate is disclosed. The method comprises providing a substrate in a reaction chamber, providing a first precursor into the reaction chamber in a vapor phase; and providing a reactant into the reaction chamber in a vapor phase to deposit the material comprising the metal or semimetal on the substrate, wherein the reactant comprises a compound of formula (V);

(V)

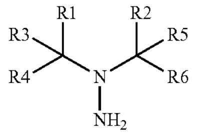

wherein R1 and R2 are independently selected from linear and branched C1 to C6 alkyl groups, and R3 and R6 from H and linear and branched C1 to C6 alkyl groups. Any two of R1 to R6 may connect to form a ring. In some embodiments, R1 and R2 form a 5- or 6-membered ring together with the nitrogen atom. In some embodiments, the material comprising a metal or a semimetal comprises a metal nitride. For example, at least one of R1 to R6 is not hydrogen. In some embodiments, one of R1 to R6 is hydrogen. In some embodiments, two of R1 to R6 are hydrogen. In some embodiments, three of R1 to R6 are hydrogen. In some embodiments, one of R1 to R6 is not hydrogen. In some embodiments, two of R1 to R6 are not hydrogen. In some embodiments, three of R1 to R6 are not hydrogen.

In yet a further aspect, a method of depositing material comprising a metal or semimetal on a substrate is disclosed. The method comprises providing a substrate in a reaction chamber, providing a first precursor into the reaction chamber in a vapor phase, and providing a reactant into the reaction chamber in a vapor phase to deposit the material comprising the metal or semimetal on the substrate, wherein the reactant comprises a compound of formula (VI), (VI)

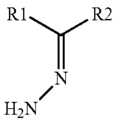

wherein R1 and R2 are independently selected from H and linear, branched and cyclic C1 to C10 alkyl groups. The compounds depicted by formula (VI) may be called hydrazones. In some embodiments, R1 and R2 connect to form a ring structure. In some embodiments, the ring structure comprises five carbon atoms. In some embodiments, the ring structure comprises six carbon atoms.

In some embodiments, R1 and R2 are tert-butyl. In some embodiments, the reactant comprises a compound of formula (VIa).

(VIa)

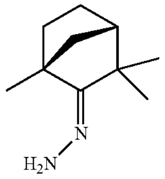

In some embodiments, the material deposited using a reactant comprising a compound of formula VI comprises a metal nitride.

As a yet another aspect, a deposition assembly for depositing a material comprising a metal or a semimetal on a substrate is disclosed. The deposition assembly comprises one or more reaction chambers constructed and arranged to hold the substrate; a precursor injector system constructed and arranged to provide a first precursor and a reactant into the reaction chamber in a vapor phase; wherein the first precursor comprises a metal or a semimetal compound. The deposition assembly further comprises a precursor vessel constructed and arranged to contain a first precursor, and the deposition assembly is constructed and arranged to provide the first precursor and the reactant via the precursor injector system to the reaction chamber to deposit a metal or semimetal-containing material on the substrate.

In a yet further aspect, a method of filling a gap is disclosed. The method comprises providing a substrate to a reaction chamber, the substrate comprising the gap, depositing a convertible layer on the substrate and providing a reactant selected from compounds (I), (Ia), (Ib), (Ic), (Id), (Ie), (If), (Ig), (Ih), (Ii), (Ij), (Ik), (Il), (Im), (In), (Io), (Ip), (II), (IIa), (IIb), (IIc), (IId), (IIe), (IIf), (IIg), (IIh), (IIi), (IIj), (III), (IV), (V), (VI) and (VIa) of the current disclosure into the reaction chamber, thereby converting at least a part of the convertible layer into a gap filling fluid, wherein the gap filling fluid at least partially fills the gap. In some embodiments, converting at least a part of the convertible layer into a gap filling fluid comprises liquefying the convertible layer. In some embodiments, the convertible layer comprises a volatilizable element, and converting at least a part of the convertible layer into a gap filling fluid comprises volatilizing the volatilizable element and forming a volatilized vapor, and condensing the volatilized vapor, thereby forming the gap filling fluid. In some embodiments, the reactant releases an H• radical. In some embodiments, the reactant releases an $NH_2$• radical. In some embodiments, the method further comprises solidifying the gap filling fluid, thereby filling the gap with a solidified material.

In some embodiments, the gap filling fluid is formed wherever a convertible layer is present on the substrate. When the substrate has a surface that is completely covered by the convertible layer, a gap filling fluid can be formed over the entire substrate surface, both outside gaps and inside gaps comprised in the substrate. When the substrate has a surface that is only partially covered by the convertible layer, then the gap filling fluid can be preferentially formed only in those places where the convertible layer is present. When the gap filling fluid is formed both outside of the gaps and inside the gaps, the gap filling fluid can, in some exemplary modes of operation, be drawn into a gap by at least one of capillary forces, surface tension, and gravity. It shall be understood that a distal portion of the gap feature refers to a portion of the gap feature that is relatively far removed from a substrate's surface, and that the proximal portion of a gap feature refers to a part of the gap feature that is closer to the substrate's surface compared to the lower/deeper portion of the gap feature. In some embodiments, the convertible layer comprises an element selected from Ge, Sb, and Te.

As used herein, the term "gap filling fluid", also referred to as "flowable gap fill", may refer to a composition of matter that is liquid, or that can form a liquid, under the conditions under which is formed and which has the capability to form a solid film. A gap filling fluid can, in some embodiments, be only temporarily in a flowable state, for example when the gap filling fluid is temporarily formed through formation of liquid oligomers from gaseous monomers during a polymerization reaction, and the liquid oligomers continue to polymerize to form a solid polymeric material. For ease of reference, a solid material formed from a gap filling fluid may, in some embodiments, be simply referred to as gap filling fluid.

Depositing the convertible layer may comprise executing a cyclical deposition process. The cyclical deposition process can include cyclical CVD, ALD, or a hybrid thereof.

In some embodiments, the convertible layer comprises a group IIIA element. Suitable group IIIA elements include B, Al, Ga, and In. In some embodiments, the convertible layer comprises a group IVA element. Suitable group IVA elements include C, Si, Ge, and Sn. In some embodiments, the convertible layer comprises a group VA element. Suitable group VA elements include N, P, As, and Sb. In some embodiments, the convertible layer comprises a group VIA element. Suitable group VIA elements include O, S, Se, and Te. In some embodiments, the convertible layer comprises a transition metal. Suitable transition metals include Sc, Ti, V, Cr, Mn, Fe, Co, Ni, Cu, Zn, Y, Zr, Nb, Mo, Tc, Ru, Rh, Cd, Hf, Ta, W, and Re. In some embodiments, the convertible layer comprises a rare earth element. Suitable rare earth elements include lanthanides such as La, Ce, Pr, Nd, Pm, Sm, Eu, Gd, Tb, Dy, Ho, Er, Tm, Yb, and Lu. In some embodiments, the convertible layer comprises an elemental metal, e.g. an elemental metal having an impurity content of less than 10 atomic percent, of less than 5 atomic percent, of less than 2 atomic percent, or less than 1 atomic percent. In some embodiments, the convertible layer comprises a metal alloy. In some embodiments, the convertible layer comprises a metal oxide. In some embodiments, the metal oxide comprises titanium oxide. In some embodiments, the convertible layer comprises a metal nitride. In some embodiments, depositing the convertible layer comprises a thermal deposition process. In some embodiments, depositing the convertible layer comprises a plasma-enhanced deposition process.

After the gap has been at least partially filled with a gap filling fluid, and optionally after solidifying the gap filling fluid to form a solidified material in the gap, the method further comprises, in some embodiments, a step of converting the gap filling fluid, or the solidified material, to a converted material. In some embodiments, converting the gap filling fluid or the solidified material comprises exposing the substrate to a direct plasma. Suitable direct plasmas include direct oxygen plasmas. Thus, in some embodiments a method as described herein comprises exposing the substrate to a direct oxygen plasma. Suitably, the direct oxygen plasma employs a plasma gas comprising a gas selected from $O_2$, $H_2O$, $H_2O_2$, $O_3$, and $CO_2$. Thus, a converted material that comprises oxygen can be formed. In some embodiments, an oxide can be formed in such a way.

Other suitable direct plasmas include direct nitrogen plasma. A direct nitrogen plasma refers to a plasma that is generated in the reaction chamber in which the substrate is positioned. Thus, in some embodiments, a method as described herein comprises exposing the substrate to a direct nitrogen plasma. Suitably, the direct nitrogen plasma employs a plasma gas comprising a gas selected from $NH_3$, $N_2H_2$, $N_2$, and gas mixtures comprising $H_2$ and $N_2$. Thus, a converted material that comprises nitrogen can be formed. The solidified material can be further processed, and can be further changed into another suitable material. Thus, in some embodiments, a method as described herein further comprises a step of converting the gap filling fluid or the solidified material into a converted material. For example, converting the gap filling fluid or the solidified material to a converted material can comprise a step of exposing the substrate to a direct plasma, such as a direct nitrogen plasma. In some embodiments, a nitride can be formed in such a way.

However, it is to be understood that the reactants disclosed herein may replace the above-mentioned plasma treatments. Especially, in embodiments, in which material comprising nitrogen is formed, reactants that release an $NH_2$• radical may be useful.

In some embodiments, a method as described herein comprises exposing the substrate to a reducing agent after at least a part of the convertible layer has been converted into a gap filling fluid, and before converting the gap filling fluid to a converted material. Suitable reducing agents include hydrogen-comprising gasses, hydrogen radicals, and direct hydrogen plasmas. Alternatively, reactants according to the current disclosure, especially ones capable of generating H• radicals may be used in place of reducing agents.

In some embodiments, converting the gap filling fluid or the solidified material comprises exposing the gap filling fluid or the converted material to a reduction step and to an oxidation step. In some embodiments, the reduction step precedes the oxidation step. Alternatively, the oxidation step can precede the reduction step. In some embodiments, the reduction step comprises exposing the substrate to a hydrogen plasma or to a reactant according to the current disclosure. Suitable reactants may include compounds I, wherein Q=—OH, such as compounds (Ia), (Ie), (Ig), (Ih), (Ij), (Im), (In), compounds (II), wherein Z=H, such as (IIa), (IIb), (IIc), (IId), (IIe), (IIh), compounds III, wherein Z=H, and compounds IV. In some embodiments, the oxidation step comprises exposing the substrate to an oxygen plasma.

In some embodiments, converting the gap filling fluid or the solidified material comprises exposing the gap filling fluid or the converted material to a reduction step and to a nitridation step. It shall be understood that a nitridation step refers to a step of converting a material into a nitride. In some embodiments, the reduction step precedes the nitridation step. Alternatively, the nitridation step can precede the reduction step. In some embodiments, the reduction step comprises exposing the substrate to a hydrogen plasma or to a reactant described above. In some embodiments, the nitridation step comprises exposing the substrate to a nitrogen plasma or to a reactant according to the current disclosure. Suitable nitrogen plasmas include plasmas in which the plasma gas comprises at least one of $N_2$, $NH_3$, and $N_2H_2$. Suitable reactants include compounds (I), wherein Q=$NH_2$, such as (Ib), (Ic), (Id), (If), (Ii), (Ik), (Il), (Io), (Ip), compounds (II), wherein Z=$NH_2$, such as (IIa), (IIb), (IIc), (IId), (IIe), (IIh), compounds (III), wherein Z=$NH_2$ or NH—$NH_2$, and compounds (IV), (V), (VI) and (VIa).

In some embodiments, the convertible layer comprises an element selected from Nb, Ta, V, Ti, Zr, and Hf. In some embodiments, the convertible layer comprises an element selected from Mn, Re, Ru, Os, Ir, Pb, Rh, Ga, Te, Ge, Gd and Pd. In some embodiments, the convertible layer comprises rhodium (Rh). In some embodiments, the convertible layer comprises iron (Fe). In some embodiments, the convertible layer comprises chromium (Cr). In some embodiments, the convertible layer comprises molybdenum (Mo). In some embodiments, the convertible layer comprises tungsten (W). In some embodiments, the convertible layer comprises gold (Au). In some embodiments, the convertible layer comprises silver (Ag). In some embodiments, the convertible layer comprises platinum (Pt). In some embodiments, the convertible layer comprises nickel (Ni). In some embodiments, the convertible layer comprises copper (Cu). In some embodiments, the convertible layer comprises cobalt (Co). In some embodiments, the convertible layer comprises zinc (Zn), for example metallic Zn or an inorganic Zn compound. In some embodiments, the convertible layer comprises aluminum (Al). In some embodiments, the convertible layer comprises indium (In). In some embodiments, the convertible layer comprises tin (Sn). In some embodiments, the convertible layer comprises bismuth (Bi).

In some embodiments, a conversion process of metal halide-comprising material to metal nitride-comprising material is disclosed. In some embodiments, a metal halide-comprising materials consists substantially of, or consists of a metal halide. Examples of metal halides that may be converted to a corresponding metal nitride include titanium fluoride, such as $TiF_4$. In some embodiments, the metal nitride consists substantially of, or consists of, a metal nitride. In some embodiments, the metal nitride comprises sufficient amounts of the metal nitride to produce a gapfilling material suitable for the manufacture of semiconductor devices. In embodiments in which a metal halide is converted to a metal nitride, compounds (I), wherein Q=$NH_2$, such as (Ib), (Ic), (Id), (If), (Ii), (Ik), (Il), (Io), (Ip), compounds (II), wherein Z=$NH_2$, such as (IIa), (IIb), (IIc), (IId), (IIe), (IIh), compounds (III), wherein Z=$NH_2$ or NH—$NH_2$, and compounds (IV), (V), (VI) and (VIa) may be especially useful. In some embodiments, converting the gap filling fluid to form a converted material can occur at least partially simultaneously with forming the gap filling fluid. For example, when a plasma employing a plasma gas that comprises both a halogen and a conversion reactant is used, then a gap filling fluid can be formed which is readily converted to form a converted material. Thus a plasma that employs a plasma gas that comprises a halogen and an oxygen reactant such as an oxygen-containing substance such as $O_2$ can be employed for filling a gap with an oxide. Or, a plasma that employs a plasma gas that comprises a halogen and a reducing agent such as a hydrogen-containing substance such as $H_2$ can be employed for filling a gap with a metal. Or, a plasma that employs a plasma gas that comprises a halogen and a nitridation agent such as a nitrogen-containing substance such as $N_2$ can be used for filling a gap with a nitride. Or, a plasma that employs a plasma gas that comprises a halogen and a carburization agent such as a carbon-containing substance such as an alkane such as $CH_4$ can be used for filling a gap with a carbide.

In an aspect, a composition for depositing a metal or semimetal-comprising material on a substrate is disclosed. The composition comprises a reactant according to the current disclosure, such as a compound selected from group of compounds (I) to (VI) according to the current disclosure. In some embodiments, the composition according to the current disclosure is liquid at room temperature. In some embodiments, the vapor pressure of the composition is ≥1 Torr at a temperature below 150° C. In some embodiments, the decomposition temperature of the composition, or a reactant contained in the composition is at least 30° C. higher than a vapor delivery temperature used to deposit a metal or a semimetal-comprising material. In some embodiments, the composition according to the current disclosure is substantially stable for at least 3 months at source temperature. In some embodiments, a composition according to the current disclosure comprises a compound selected from a group consisting of compounds (I), (Ia), (Ib), (Ic), (Id), (Ie), (If), (Ig), (Ih), (Ii), (Ij), (Ik), (Il), (Im), (In), (Io), (Ip), (II), (IIa), (IIb), (IIc), (IId), (IIe), (IIf), (IIg), (IIh), (IIi), (IIj), (III), (IV), (V), (VI) and (VIa) disclosed herein.

DRAWINGS

The disclosure is further explained by the following exemplary embodiments depicted in the drawings. The illustrations presented herein are not meant to be actual views of any particular material, structure, device or an apparatus, but are merely schematic representations to describe embodiments of the current disclosure. It will be appreciated that elements in the figures are illustrated for simplicity and clarity and have not necessarily been drawn to scale. For example, the dimensions of some of the elements in the figures may be exaggerated relative to other elements to help improve the understanding of illustrated embodiments of the present disclosure. The structures and devices depicted in the drawings may contain additional elements and details, which may be omitted for clarity.

In the first phase 102, a substrate is provided into a reaction chamber. A substrate according to the current disclosure may comprise, for example, an oxide, such as silicon oxide (for example thermal silicon oxide or native silicon oxide), aluminum oxide, or a transition metal oxide, such as hafnium oxide. A substrate may comprise a nitride, such as silicon nitride or titanium nitride, a metal, such as copper, cobalt or tungsten, chalcogenide material, such as molybdenum sulfide. The deposited metal or semimetal-comprising material according to the current disclosure may form layers that can be used in the manufacture of electronic devices. A metal or semimetal-comprising material deposited according to the current disclosure, such as elemental metal, elemental semimetal, metal nitride or a semimetal nitride, may be used in the manufacture of photovoltaic devices. Depending on the application in question, the layer properties may differ. For example, layers of different thicknesses may be deposited. Also, the metal or semimetal-comprising material may be doped with another material, either a metal, semimetal or a non-metal to amend its properties.

The reaction chamber can form part of an atomic layer deposition (ALD) assembly. The reaction chamber can form part of a chemical vapor deposition (CVD) assembly. The assembly may be a single wafer reactor. Alternatively, the reactor may be a batch reactor. The assembly may comprise one or more multi-station deposition chambers. Various phases of method 100 can be performed within a single reaction chamber or they can be performed in multiple reaction chambers, such as reaction chambers of a cluster tool. In some embodiments, the method 100 is performed in a single reaction chamber of a cluster tool, but other, preceding or subsequent, manufacturing steps of the structure or device are performed in additional reaction chambers of the same cluster tool. Optionally, an assembly including the reaction chamber can be provided with a heater to activate the reactions by elevating the temperature of one or more of the substrate and/or the reactants and/or precursors. The metal or semimetal-comprising material according to the current disclosure may be deposited in a cross-flow reaction chamber. The metal or semimetal-comprising material according to the current disclosure may be deposited in a shower head-type reaction chamber.

A first precursor is provided in the reaction chamber containing the substrate at phase 104. The first precursor may be a metal precursor used for depositing metal-comprising material on the substrate. The first precursor may be a semimetal precursor used for depositing semimetal-comprising material on the substrate. Without limiting the current disclosure to any specific theory, first precursor may chemisorb on the substrate during providing first precursor into the reaction chamber. The duration of providing first precursor into the reaction chamber (first precursor pulse time) may be, for example, from about 0.1 to about 15 seconds, from about 0.5 to about 10 seconds, from about 0.5 to about 5 seconds, or from about 0.5 to about 3 seconds. For example, the first precursor pulse time may be about 0.5 seconds, 1 second, 1.5 seconds, 2 seconds, 3 seconds, 3.5 seconds, 5 seconds, 7 seconds, or 10 seconds. In some embodiments, the first precursor pulse time may be shorter than 25 s, shorter than 15 s, shorter than 8 s, shorter than 5 s, or shorter than 2 s. The duration depends on the precursor used, and on the application, for example. In some embodiments, a saturating pulsing is used. In some embodiments, a non-saturating pulsing regime is used.

When the reactant is provided in the reaction chamber at phase 106, it may release a reactive radical species, to react with the chemisorbed first precursor, or its derivate species. In embodiments of the current disclosure, the reactant may generate a reactive radical species and a long-lived radical species, such that predominantly or substantially only, the reactive radical reacts with the first precursor. The reactive radical may be hydrogen radical. The reactive radical may be amino radical. The structure of the long-lived radical depends on the type of compound used as the reactant. The reactant may comprise any of the reactants disclosed herein, such as any of compounds depicted in formulas (I) to (VI).

The duration of providing a reactant in the reaction chamber (reactant pulse time) may be, for example from about 0.1 to about 15 seconds, from about 0.5 to about 10 seconds, from about 0.5 to about 5 seconds, or from about 0.5 to about 3 seconds. The duration depends on the reactant, the first precursor used, and on the application, for example. In some embodiments, the reactant pulse time may be shorter than 25 s, shorter than 15 s, shorter than 8 s, shorter than 5 s, or shorter than 2 s.

In some embodiments, first precursor is heated when providing it into the reaction chamber. In some embodiments, reactant is heated when providing it to the reaction chamber. In some embodiments, the first precursor is kept in ambient temperature before providing it to the reaction chamber. In some embodiments, the reactant is kept in ambient temperature before providing it to the reaction chamber.

Phases 104 and 106, performed in any order, may form a deposition cycle, resulting in the deposition of metal or semimetal-comprising material (phase 110) on the substrate surface. In some embodiments, the two phases of metal or semimetal-comprising material deposition, namely providing the first precursor and the reactant in the reaction chamber (104 and 106), may be repeated (loop 108). Such embodiments contain several deposition cycles. The thickness of the deposited metal or semimetal-comprising material may be regulated by adjusting the number of deposition cycles. The deposition cycle (loop 108) may be repeated until a desired transition metal or semimetal-comprising material thickness is achieved. For example, about 50, 100, 200, 300, 400, 500, 700, 800, 1,000, 1,200, 1,500 or 2,000 deposition cycles may be performed.

The deposition process of FIG. 1 may comprise purging the reaction chamber after providing a first precursor in the reaction chamber 104, and after providing a reactant in the reaction chamber at 106. However, in some embodiments, only one purge phase is performed. In some embodiments, both purge phases are performed. The duration of the purge phases may be the same or different. The selection of an appropriate purge phase length depends on the first precursor and reactant properties, on the substrate topology, as well as on other parameters of the deposition process.

In an exemplary embodiment, metallic cobalt may be deposited using $CpCo(CO)_2$ as a first precursor (metal precursor) and a compound of formula IIi as a reactant. The deposition may be performed at a temperature of, for example, from about 130° C. to about 350° C., such as 130° C., 150° C. or 250° C. The substrate may be a silicon-comprising substrate, such as silicon, silicon oxide, silicon nitride, silicon oxynitride, silicon carbide, silicon oxycarbide. For example, a silicon-comprising substrate may comprise silicon and oxygen, silicon and nitrogen, silicon and carbon, silicon and oxygen. In some embodiments, a metal, such as cobalt, may be deposited on metal surface, such as a cobalt surface, a copper surface or a molybdenum surface. Alternatively, the deposition may be performed on other types of substrates, such as borosilicate glass. Each of a first precursor and a reactant may be provided into the reaction chamber in pulses of about 0.5 seconds, and the reaction chamber may be purged between two consecutive pulses. Nitrogen may be used as a carrier gas. The deposition may be cyclic deposition, wherein pulsing the first precursor and the reactant may comprise a deposition cycle. The deposition cycle may be performed from about 100 to about 1,000 times, such as about 300 times or about 500 times. Alternatively, a reactant such as 1-hydroxy-2,2,6,6-tetramethylpiperidine (i.e. a compound according to formula Ij) may be used.

Figure 2:
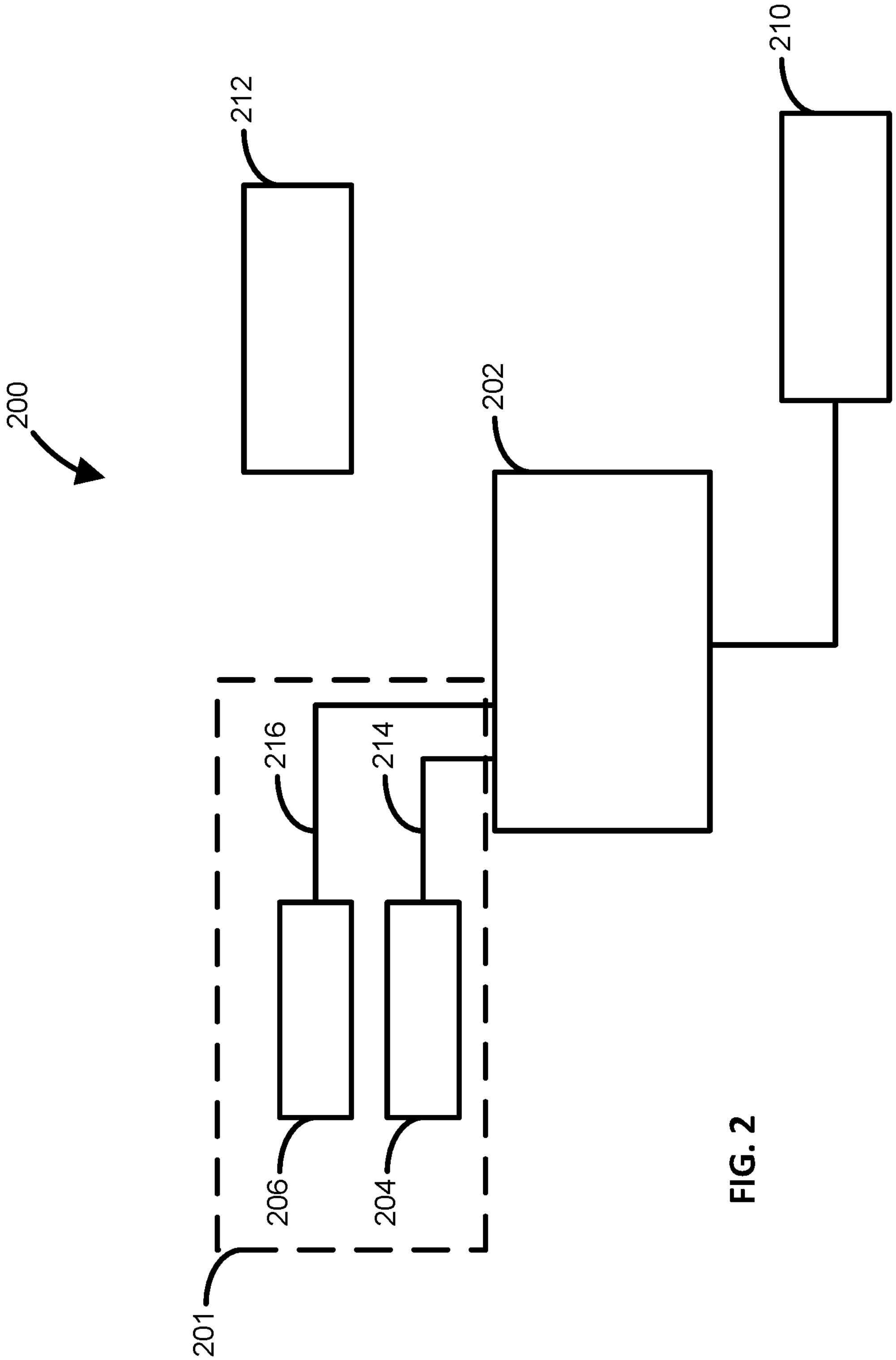
FIG. 2 is a schematic presentation of a deposition assembly according to the current disclosure.

If nitride material is deposited, a nitrogen-containing reactant, such as tris(trimethylsilyl)silylhydrazine (an embodiment of the compound according to formula III, in which Z is —NH—$NH_2$, and all R1 to R9 are methyl) is used as the reactant- FIG. 2 illustrates a deposition assembly 200 according to the current disclosure in a schematic manner. Deposition assembly 200 can be used to perform a method as described herein and/or to form a layer, a structure or a device, or a portion thereof as described herein.

In the illustrated example, deposition assembly 200 includes one or more reaction chambers 202, a precursor injector system 201, a precursor vessel 204, a reactant vessel 206, an exhaust source 210, and a controller 212. The deposition assembly 200 may comprise one or more additional gas sources (not shown), such as an inert gas source, a carrier gas source and/or a purge gas source. Also, in case materials comprising additional elements are deposited, the deposition assembly may further comprise additional precursor vessels.

Reaction chamber 202 can include any suitable reaction chamber, such as an ALD or CVD reaction chamber as described herein.

The precursor vessel 204 can include a vessel and a first precursor as described herein-alone or mixed with one or more carrier (e.g., inert) gases. A reactant vessel 206 can include a vessel and a reactant as described herein-alone or mixed with one or more carrier gases. Although illustrated with two source vessels 204 and 206, deposition assembly 200 can include any suitable number of source vessels. Source vessels 204 and 206 can be coupled to reaction chamber 202 via lines 214 and 216, which can each include flow controllers, valves, heaters, and the like. In some embodiments, the first precursor in the precursor vessel 204 and/or the reactant in the reactant vessel 206 may be heated. In some embodiments, the temperature of the precursor vessel is regulated so that it is below about 200° C., such as between 80° C. and about 200° C. In some embodiments, the temperature of the reactant vessel is regulated so that it is below about 200° C., such as between about 50° C. and about 150° C.

Exhaust source 210 can include one or more vacuum pumps.

Controller 212 includes electronic circuitry and software to selectively operate valves, manifolds, heaters, pumps and other components included in the deposition assembly 200. Such circuitry and components operate to introduce precursors, other optional reactants and purge gases from the respective sources. Controller 212 can control timing of gas pulse sequences, temperature of the substrate and/or reaction chamber 202, pressure within the reaction chamber 202, and various other operations to provide proper operation of the deposition assembly 200. Controller 212 can include control software to electrically or pneumatically control valves to control flow of precursors, reactants and purge gases into and out of the reaction chamber 202. Controller 212 can include modules such as a software or hardware component, which performs certain tasks. A module may be configured to reside on the addressable storage medium of the control system and be configured to execute one or more processes.

Other configurations of deposition assembly 200 are possible, including different numbers and kinds of precursor and reactant sources. Further, it will be appreciated that there are many arrangements of valves, conduits, precursor sources, and auxiliary reactant sources that may be used to accomplish the goal of selectively and in coordinated manner feeding gases into reaction chamber 202. Further, as a schematic representation of a deposition assembly, many components have been omitted for simplicity of illustration, and such components may include, for example, various valves, manifolds, purifiers, heaters, containers, vents, and/or bypasses.

During operation of deposition assembly 200, substrates, such as semiconductor wafers (not illustrated), are transferred from, e.g., a substrate handling system to reaction chamber 202. Once substrate(s) are transferred to reaction chamber 202, one or more gases from gas sources, such as precursors, other optional reactants, carrier gases, and/or purge gases, are introduced into reaction chamber 202.

In some embodiments, a first precursor is supplied in pulses, a reactant is supplied in pulses and the reaction chamber is purged between consecutive pulses of first precursor and a reactant.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method of depositing material comprising a metal on a substrate by a cyclic vapor deposition process, the method comprising providing a substrate in a reaction chamber;

providing a first precursor into the reaction chamber in a vapor phase; and providing a reactant into the reaction chamber in a vapor phase, wherein the reactant comprises a compound of formula (I),

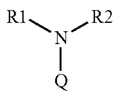

(I)

wherein R1 and R2 are the same or different, and independently selected from H, linear and branched alkyl groups, each comprising at least two carbon atoms, and Q is —OH or wherein when Q is —$NH_2$, R1 and R2 are the same or different, and independently selected from linear and branched alkyl groups, each comprising at least two carbon atoms, or wherein R1 and R2 connect to form a ring structure and Q is —OH or —$NH_2$, wherein the first precursor is a metal precursor, the reactant releases a reactive radical species and a long-lived radical species, and wherein the reactive radical species reacts with the first precursor thereby depositing material comprising the metal on the substrate.

2. The method of claim 1, wherein the first precursor is a transition metal precursor.

3. The method of claim 1, wherein the metal of the first precursor is a main group metal.

4. The method of claim 1, wherein the first precursor comprises a ligand selected from the group consisting of beta-diketonate, amidinate, amidate, carbonyl, cyclopentadienyl, halide, alkyl, alkylamide, alkylimido, alkoxide, allyl, arene, and diazadiene.

5. The method of claim 1, wherein the reactive radical species released by the reactant is selected from a group consisting of H• and $NH_2$•.

6. The method of claim 1, wherein Q is —OH.

7. The method of claim 1, wherein R1 and R2 connect to form a ring structure, wherein the ring structure comprises nitrogen and four carbon atoms or nitrogen and five carbon atoms.

8. The method of claim 1, wherein the long-lived radical species released by the reactant comprises at least four carbon atoms.

9. The method of claim 8, wherein the long-lived radical species released by the reactant comprises at least eight carbon atoms.

10. The method of claim 1, wherein the reactant releases a hydrogen radical (H•), and the material comprising a metal deposited on the substrate is an elemental metal.

11. The method of claim 1, wherein the reactant releases an amino radical ($NH_2$•), and the material comprising a metal deposited on the substrate comprises nitrogen.

12. The method of claim 11, wherein the material comprising a metal comprises a metal nitride.

13. The method of claim 1, wherein the method of depositing material is performed at a temperature that is lower than 200° C.

14. The method of claim 1, wherein a temperature in the reaction chamber is higher than the temperature of a source vessel of the reactant.

15. The method of claim 1, wherein the cyclic vapor deposition process comprises providing the first precursor and the reactant alternately and sequentially into the reaction chamber.

16. The method of claim 1, wherein the reaction chamber is purged between providing the first precursor and the reactant into the reaction chamber.

17. A method of depositing material comprising a metal on a substrate by a cyclic vapor deposition process, the method comprising providing a substrate in a reaction chamber;

providing a first precursor into the reaction chamber in a vapor phase; and providing a reactant into the reaction chamber in a vapor phase, wherein the first precursor is $CpCo(CO)_2$, the reactant is compound IIi, and the deposited material is metallic cobalt.

18. A method of depositing material comprising a metal on a substrate by a cyclic vapor deposition process, the method comprising providing a substrate in a reaction chamber;

providing a first precursor into the reaction chamber in a vapor phase; and providing a reactant into the reaction chamber in a vapor phase, wherein the first precursor is a metal precursor, the reactant releases a reactive radical species and a long-lived radical species, wherein the long-lived radical species released by the reactant comprises at least four atoms, and wherein the reactive radical species reacts with the first precursor to deposit material comprising the metal on the substrate.

19. The method of claim 18, wherein the long-lived radical species released by the reactant comprises at least eight carbon atoms.

20. The method of claim 18, wherein the first precursor is a transition metal precursor or wherein the metal of the first precursor is a main group metal.

21. The method of claim 18, wherein the first precursor comprises a ligand selected from the group consisting of beta-diketonate, amidinate, amidate, carbonyl, cyclopentadienyl, halide, alkyl, alkylamide, alkylimido, alkoxide, allyl, arene, and diazadiene.

22. The method of claim 18, wherein the reactant releases a hydrogen radical (H•), and the material comprising a metal deposited on the substrate is an elemental metal.

23. The method of claim 18, wherein the reactant releases an amino radical ($NH_2$•), and the material comprising a metal deposited on the substrate comprises nitrogen.

24. The method of claim 23, wherein the material comprising a metal comprises a metal nitride.

* * * * *